United States Patent [19]

Kumagai et al.

[11] Patent Number: 5,563,821
[45] Date of Patent: Oct. 8, 1996

[54] SEMICONDUCTOR MEMORY DEVICE HAVING A PROGRAM CIRCUIT FOR SELECTING DEVICE TYPE

[75] Inventors: Takashi Kumagai; Toshio Orii, both of Suwa, Japan

[73] Assignee: Seiko Epson Corporation, Nagano-ken, Japan

[21] Appl. No.: 253,058

[22] Filed: Jun. 2, 1994

Related U.S. Application Data

[63] Continuation of PCT/JP93/01418, filed Oct. 4, 1993.

[30] Foreign Application Priority Data

Oct. 2, 1992 [JP] Japan ................................. 4-264927
Apr. 7, 1993 [JP] Japan ................................. 5-080902

[51] Int. Cl.$^6$ ...................................... G11C 7/00
[52] U.S. Cl. .................. 365/96; 365/225.7; 365/230.02; 365/230.06
[58] Field of Search ................ 365/225.7, 94, 365/96, 230.06, 189.02, 230.02, 189.03, 230.03

[56] References Cited

U.S. PATENT DOCUMENTS

| | | | |
|---|---|---|---|
| 4,721,868 | 1/1988 | Cornell et al. ................. | 307/465 |
| 5,287,311 | 2/1994 | Tso et al. ......................... | 365/225.7 |

FOREIGN PATENT DOCUMENTS

| | | |
|---|---|---|
| 60-105252 | 6/1985 | Japan . |
| 61-61440 | 3/1986 | Japan . |
| 63-94658 | 4/1988 | Japan . |
| 1-278744 | 11/1989 | Japan . |
| 2-5458 | 1/1990 | Japan . |
| 3-168998 | 7/1991 | Japan . |

Primary Examiner—David C. Nelms
Assistant Examiner—Vu A. Le
Attorney, Agent, or Firm—Loeb & Loeb LLP

[57] ABSTRACT

This semiconductor memory device has an input circuit to which an external signal is connected, a program circuit which includes fuses capable of being cut, the program circuit determining the product type of the memory device by the combination of the cut fuses, and the operation of the input stage of the input circuit being controlled by the output of the program circuit. By simply cutting prescribed fuses after the end of the semiconductor manufacturing process, such things at outside elements become unnecessary, and the product type can be selected without an increase in the consumption current at the input circuit. Further, photomasks for each product type become unnecessary, mask management becomes simpler and management for different product types during the manufacturing process becomes unnecessary. Also, adjustments for production levels after manufacturing, adjustments for stock, and production control becomes easier.

9 Claims, 13 Drawing Sheets

```
A14  — 1        28 — VDD
A12  — 2        27 — XWE
A7   — 3        26 — A13
A6   — 4        25 — A8
A5   — 5        24 — A9
A4   — 6        23 — A11
A3   — 7        22 — XOE
A2   — 8        21 — A10
A1   — 9        20 — XCS
A0   — 10       19 — I/O8
I/O1 — 11       18 — I/O7
I/O2 — 12       17 — I/O6
I/O3 — 13       16 — I/O5
VSS  — 14       15 — I/O4
```

FIG. 9A

PRIOR ART

```
A14  — 1        28 — VDD
A12  — 2        27 — XWE
A7   — 3        26 — A13
A6   — 4        25 — A8
A5   — 5        24 — A9
A4   — 6        23 — A11
A3   — 7        22 — CS2
A2   — 8        21 — A10
A1   — 9        20 — XCS1
A0   — 10       19 — I/O8
I/O1 — 11       18 — I/O7
I/O2 — 12       17 — I/O6
I/O3 — 13       16 — I/O5
VSS  — 14       15 — I/O4
```

FIG. 9B

PRIOR ART

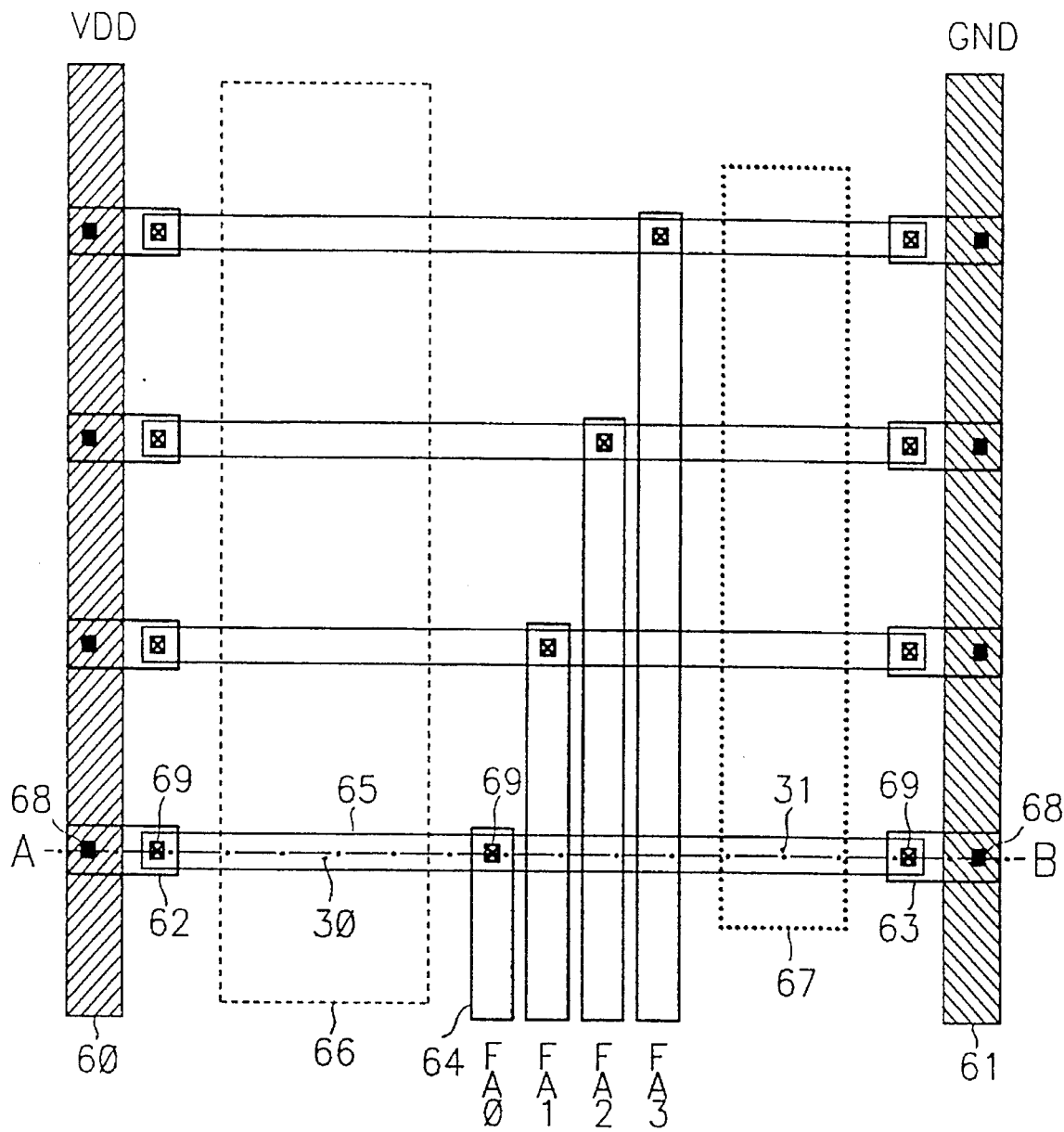
FIG. 11
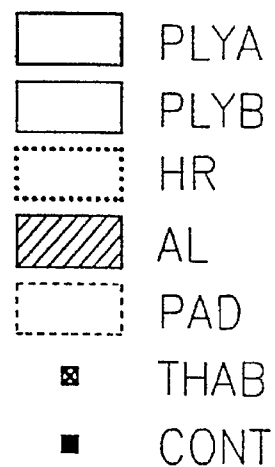

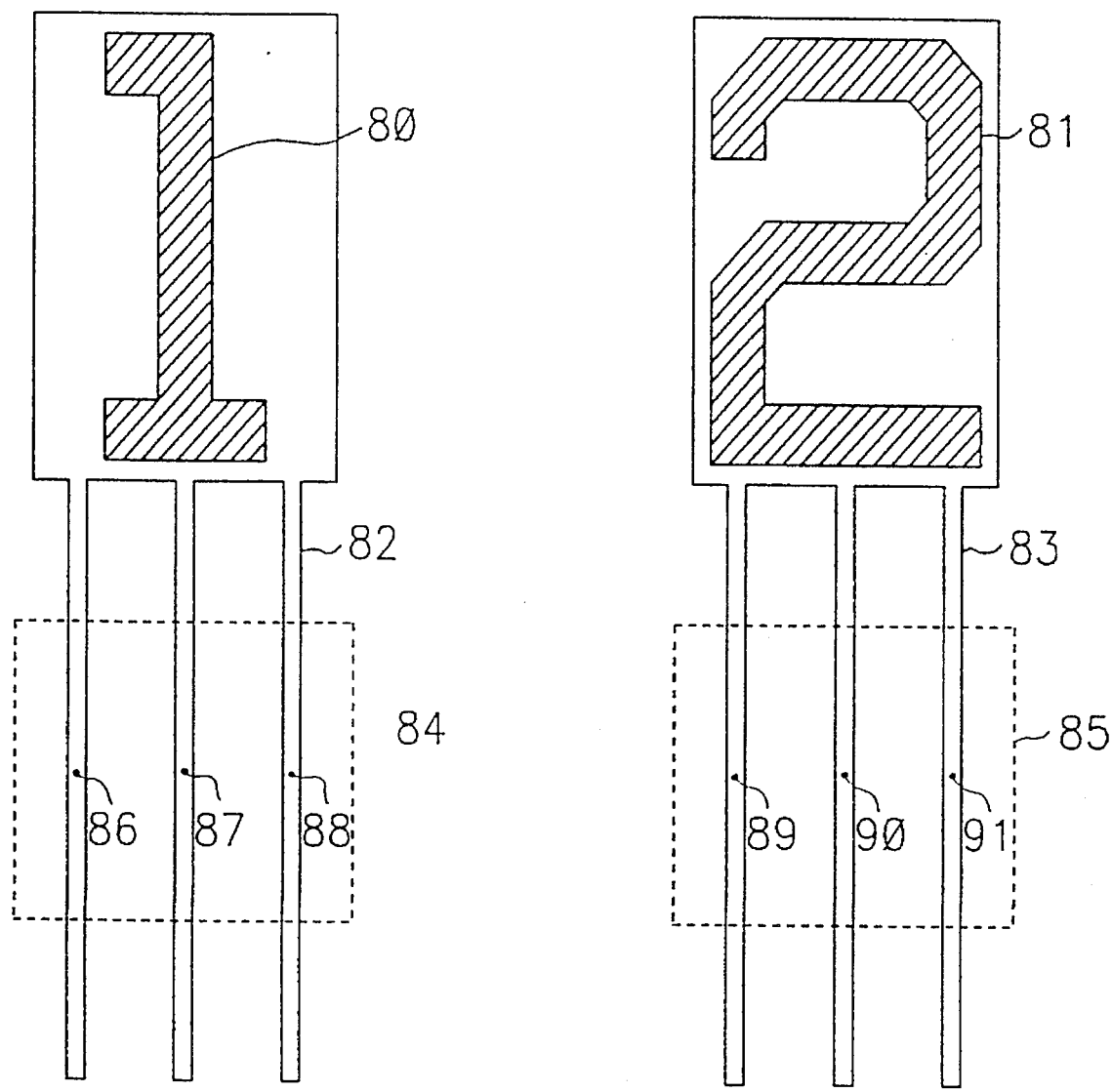
FIG. 13
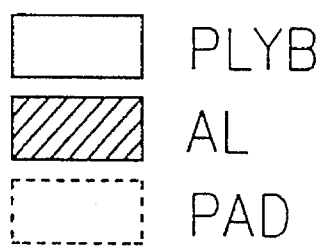

SEMICONDUCTOR MEMORY DEVICE HAVING A PROGRAM CIRCUIT FOR SELECTING DEVICE TYPE

CROSS-REFERENCE TO RELATED APPLICATION

This is a continuation of International Application No. PCT/JP93/01418 filed on Oct. 4, 1993.

FIELD OF THE INVENTION

This invention relates, in general, to a semiconductor memory device that is based on a common semiconductor substrate which can be configured into a plurality of product types at the end of the semiconductor manufacturing process and, in particular, to a control system of the input stages of the input circuits of such a memory device.

BACKGROUND OF THE INVENTION

In keeping pace with recent developments in semiconductor memory devices, techniques can be used to manufacture from a common semiconductor substrate a plurality of product types whose word structure, for the same memory contents, or control function differ.

As one example, FIGS. 9A and 9B show the external pin, or lead, arrangement of a 256K bit static random access memory ("SRAM"). Pins, or leads, extend out of the memory package for installation in a socket. There are 28 pins; fifteen address pins (A0–A14), eight input/output pins (I/01–I/08), VDD, VSS, and three control pins. The control pins in FIG. 9A are write control pin XWE, output control pin XOE, and chip select control pin XCS. All negative-logic signals in the figures and description begin with the letter X. Thus, all control pins in FIG. 9A are negative logic.

FIG. 9B shows an arrangement where a positive-logic chip select control pin, pin CS2, is used in place of pin XOE of FIG. 9A. Pin XCS1 continues to be the negative logic chip select control pin. In other words, pin 22 is changed from XOE to CS2. Users of the semiconductor memory devices can separate the use of the above two types from system structures. Particularly a memory having pins XCS1 and CS2 can be used in battery backup applications.

FIGS. 7A and 7B, as well as FIGS. 1, 3 and 5, depict circuit components on a chip in an IC package. Each element identified as a "Pad" is a bonding pad on a chip and can be connected to a selected pin by a bonding wire (not shown).

FIGS. 7A and 7B are circuit diagrams showing input circuits for the control signal in conventional semiconductor memory devices. FIG. 7A shows the input circuits for the XCS and XOE type control signals. FIG. 7B shows the input circuits for the XCS1 and CS2 type control signals.

In FIG. 7A, pad 20 is a bonding pad connected to a pin XCS for receiving and transferring an extend chip select signal which comes from outside the device. Pad 22 is a bonding pad connected to a pin XOE for receiving and transferring an output control signal which comes from outside the device. Although NOR gate 200 is an input stage for a positive logic chip select signal, in this memory type CS2 is not used. One input of NOR gate 200 is fixed to VDD and internal signal XCS2a is fixed or normally low. In the illustrated circuit, the other input of gate 200 is connected to VSS (ground) via a resistor 203. NOR gate 100 is an input stage for receiving the external chip select signal. One input of gate 100 is connected to pad 20 and the other input is connected to receive the above-mentioned signal XCS2a.

Internal control signal XCS1b is output through inverter 101. Because XCS2a is normally low, XCS1b is synchronized with the external chip select signal. NOR gate 300 is an input stage which receives the output control signal. One input of gate 300 is connected to Pad 22 and the other input is connected to receive the above-mentioned signal XCS1b. Internal control signal XOEa is output through inverter 301. When the external chip select signal is low, in other words only during chip select, NOR gate 300 operates as XOE. When the XCS signal is high, that is to say during chip non-select, the operation of NOR gate 300 is inhibited and internal signal XOEa is fixed at the high level. This is to stop the data output operation from the memory device when in the non-select state, and at the same time prevents unnecessary current consumption at NOR gate 300 due to change in potential of the output control signal. Similarly, by taking the logic of an external address signal and XCS1b at the input stage of the address input circuit, low current consumption during non-select times can be realized. The operating waveforms of the conventional semiconductor memory device of FIG. 7A are shown in FIG. 8A. Internal signals XCS1b, CS2b, and XOEa are used as the basic signals to form the internal control signals of the memory device.

The conventional semiconductor memory device shown in FIG. 7B is exactly the same as the structure shown in FIG. 7A, except for: positive-logic chip select control signal at pin CS2 being supplied to Pad 22; one input of NOR gate 200 being connected to Pad 22; and one input of NOR gate 300 being connected to VSS by a resistor. With this construction, internal signal XCS2a becomes the inverse signal, or complement, of positive-logic chip select control signal at CS2. Internal signal XCS1b is synchronized with XCS1 when the CS2 signal is high and is fixed at the high level when the CS2 signal is low. Also, when the CS2 signal is high and the XCS1 signal is low, in other words when in the chip select state, internal signal XOEa goes low. When the CS2 signal is low or XCS1 is high, in other words when in the chip non-select state, internal signal XOEa goes high. The operating waveforms of the conventional semiconductor memory device of FIG. 7B are shown in FIG. 8B. Just as in FIG. 7A, internal signals XCS1b, CS2b, and XOEa are used as basic signals for forming internal control signals for the device.

When changing the product type of a conventional semiconductor memory device where the same semiconductor substrate is arranged with the necessary input circuit elements for a plurality of product types, a portion of the photomask for wiring, for example, metal masks (masks for metal wiring), are prepared for the memory types of FIG. 7A or FIG. 7B. The changes for these product types are then made at the time of wiring during the semiconductor manufacturing process. At the end of the manufacturing process, recognition of the product type is done by examining through a microscope the code or product number that is characteristic to the product type. These codes or numbers have been arranged within the semiconductor device using the previously discussed metal masking.

Due to the above construction of conventional semiconductor devices, the following problems exist.

Because product type changeovers are made by altering a portion of the photomask, a large number of photomasks becomes necessary in the development of the product types, so that there is a cost increase due to mask construction, as well as complications that arise in controlling these masks. Also, because changes in product type cannot be made after the wiring process, production control to determine the product type becomes a necessary process during the manufacturing processing and production levels cannot be regulated after manufacturing.

The purpose of the instant invention is to provide a semiconductor memory device that solves the above problems, whose manufacturing cost does not increase, and whose product types are able to be sorted out after the semiconductor manufacturing process.

SUMMARY OF THE INVENTION

The semiconductor memory device of the instant invention comprises: a program circuit that includes a fuse which can be cut; and an input circuit which is connected to receive an external input signal controlled by the program circuit; wherein selection of the product type of the memory device is performed when the input stage of a certain input circuit is activated according to the combination of certain cut fuses.

Also, a plurality of input circuits controlled by the program circuit may be each independently connected to bonding pads. At this time, changes in the product type of the memory device are done through a combination of cut fuses of the program circuit and changes in the bonding pads.

Also, the plurality of input circuits controlled by the program circuit may be connected to a common bonding pad. Further, a plurality of switching means controlled by the program circuit may be arranged between the common bonding pad and the plurality of input circuits. In this case, changing of the product type of the memory device is done just through combinations of cut program circuit fuses.

In any case, the input stages of unnecessary input circuits are made inactive or the input potential is fixed. Changes in the product type can be made without external pullups or pulldowns and there is no increase in the consumption current at the input stages of unnecessary input circuits.

In this manner, by selecting the product type by cutting prescribed fuses after the end of the semiconductor manufacturing process, photomasks for each product type become unnecessary, there is a reduction in mask construction costs, and mask control becomes easier. Also, control methods for distinguishing product types during the manufacturing process become unnecessary, and adjustments for production levels after manufacturing, adjustments for stock, as well as production control become easier. Consequently, manufacturing cost is reduced because of a reduction in the number of managed manufacturing steps and a reduction of costs in management. Further, shorter delivery dates are able to be realized.

When none of the fuses of the program circuit are cut in the semiconductor memory device of the instant invention, the input stages of the input circuits necessary for the product type of the memory device for which demand is greatest are activated within the plurality of input circuits that are controlled by the program circuit. In this way, by setting the product type where the demand is the greatest as the product type with no cut fuses, the cutting of fuses for the selection of the product type can be minimized at the end of the semiconductor manufacturing process, the number of steps for cutting fuses can be reduced, and a short delivery time realized.

Also, in the semiconductor memory device of the instant invention, the fuse element of the program circuit that determines the product type of the memory device has the same construction as the redundant fuse element that designates the address of the redundant memory cell for defect correction. Also, the cutting of the fuse element of the program circuit is done by the same process as the cutting of the redundant fuse element.

It is also possible to cut the intrinsic dummy fuse according to the product type by the same process as the cutting of the fuse element within the program circuit and to recognize the product type of the device after selection of the product type by cutting or non-cutting of the dummy fuse or combinations of cut dummy fuses.

In this manner, by making the structure of the fuse element within the program circuit the same as the redundant fuse and by cutting the fuse element within the program circuit with the same process as cutting the redundant fuse, additional photomasks or manufacturing processes for making fuse elements and additional repair processes and inspections for cutting the fuse elements are unnecessary. Thus, the instant invention can be realized without an increase in manufacturing cost, inspection cost, manufacturing time, or inspection time. Also, by cutting the fuse element of the program circuit at the same time as cutting the dummy fuse, recognition of product types after wafer manufacturing becomes easier.

BRIEF DESCRIPTION OF THE DRAWING

FIGS. 9A and 9B are diagrams showing the external pin arrangements of a conventional semiconductor memory device.

FIG. 11 is a layout diagram showing the structure of the redundant fuse of a conventional semiconductor memory device.

FIG. 13 is a layout diagram showing the construction of dummy fuses for recognition of product types in accordance with instant invention.

DESCRIPTION OF THE PREFERRED EMBODIMENTS

Figure 1:
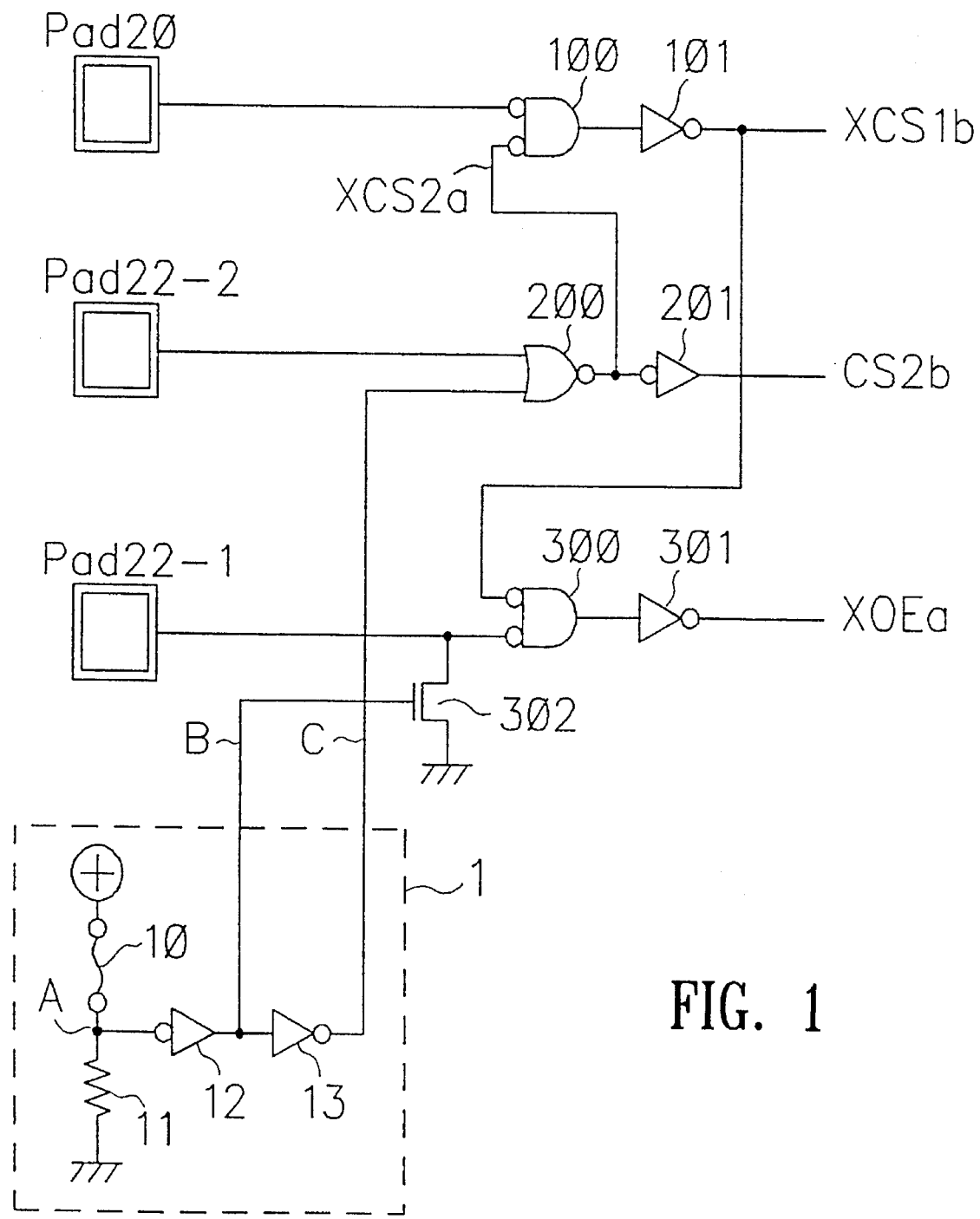
FIG. 1 is a schematic diagram of a semiconductor memory device having a program circuit and an input circuits which are controlled by the program circuit in accordance with the instant invention.

FIG. 1 is a schematic diagram of a semiconductor memory device in accordance with embodiment 1 of the instant invention. Pad 20 is a bonding pad for connection to an external chip select control pin XCS. Pad 22-1 is a bonding pad for connection to output control pin XOE. Pad 22-2 is a bonding pad for connection to positive-logic chip select control pin CS2. An exemplary program circuit 1 for selecting the product type of the semiconductor memory device is composed of a low-resistance fuse element 10, a resistor of high resistance 11, and inverters 12 and 13. In the case when fuse element 10 is not cut, connection point A, where fuse element 10 and high resistance 11 are connected, goes high. Accordingly, output B of inverter 12 goes low and output C of inverter 13 goes high. On the other hand, if fuse element 10 is cut, connection point A goes low, output B goes high and output C goes low. One input of input stage NOR gate 200, which receives the positive-logic chip select signal, is connected to Pad 22-2, and the other input is connected to output C of program circuit 1. One input of input stage NOR gate 300 is connected to Pad 22-1 and receives the output control signal. The gate of N-channel transistor 302 is connected to output B of program circuit 1, the drain is connected to the input of NOR gate 300 which is connected to Pad 22-1, and the source is connected to ground. When signal B is high, the input from Pad 22-1 is fixed low. The other circuits and connections in FIG. 1 have been described with reference to the conventional device of FIG. 7.

In FIG. 1, when fuse element 10 of program circuit 1 is not cut, output B goes low, output C goes high, N-channel transistor 302 is off, NOR gate 200 goes inactive, and the output XCS2a of NOR gate 200 is unaffected by the potential of Pad 22-2 and is fixed low. Consequently, internal signal XCS1b is synchronized with the chip select signal which comes from pad 20 (XCS). When XCS1b is low, in other words, when in the chip select state, and when the output control signal from Pad 22-1 (XOE) is low, internal signal XOEa goes low. Since n-channel transistor 302 is usually off, the operation of XOE from Pad 22-1 is not restricted.

Figure 2A:
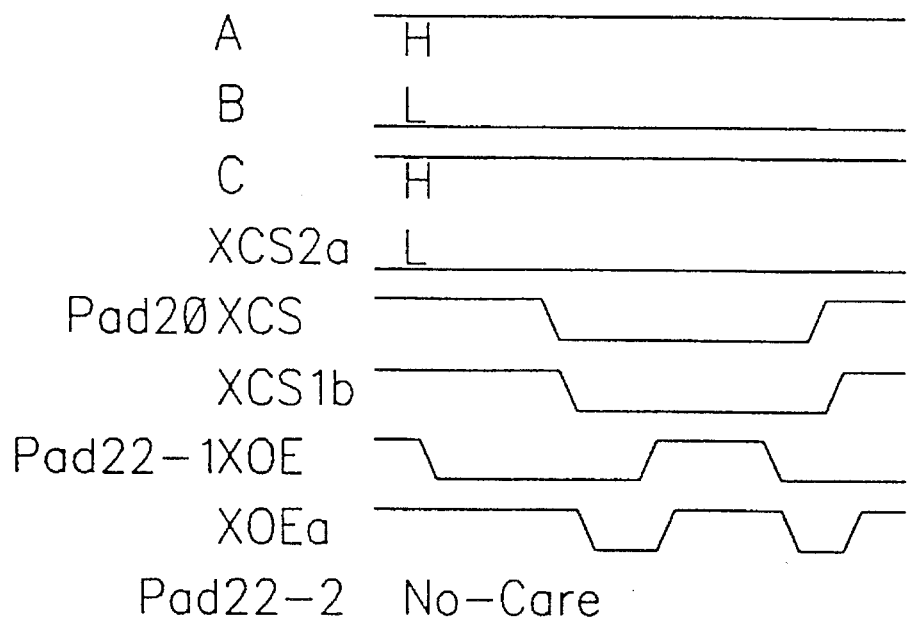
FIGS. 2A and 2B are diagrams containing operating waveforms of the circuit shown in FIG. 1.

The operating waveforms at this time are shown in FIG. 2A. These are the same as the operating waveforms of FIG. 8A for conventional devices. By connecting the pin 22 of the lead frame of FIG. 9A by a bonding wire to bonding Pad 22-1 for the output control signal, a semiconductor memory device of type XCS and XOE shown in FIG. 9A is realized, without cutting fuse element 10 of program circuit 1. Regardless of whether the signal is high or low at Pad 22-2 or even if there is no signal, the internal operating waveforms do not change and there is no operating current or direct current at NOR gate 200.

Figure 2B:
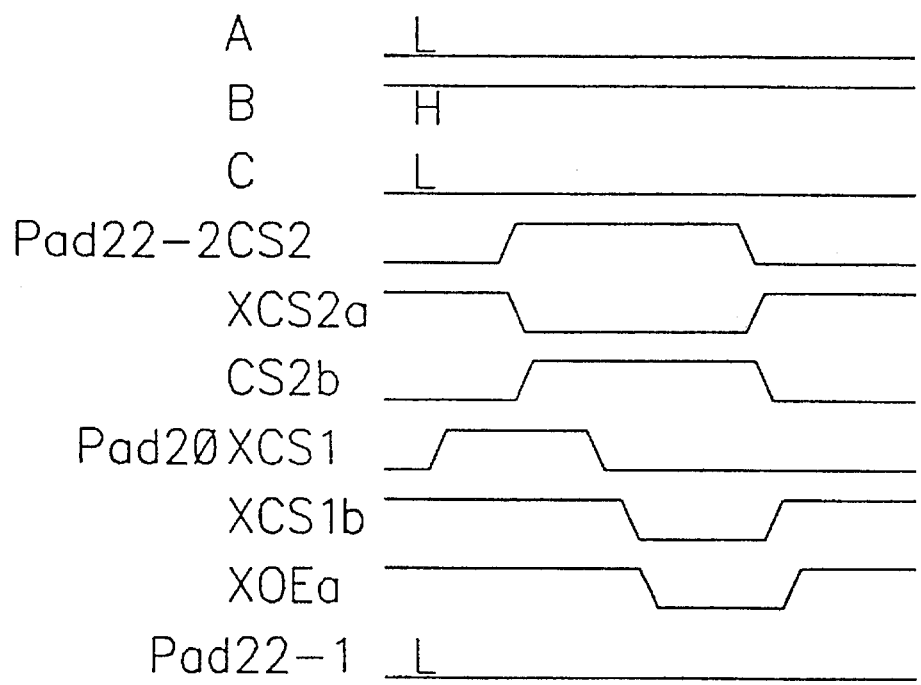

On the other hand, when fuse element 10 of program circuit 1 is cut, output B goes high, output C goes low, n-channel transistor 302 is on, NOR gate 200 is active and reverses the polarity of the positive-logic chip select signal which comes from Pad 22-2. Consequently, when the signal at pin CS2 (Pad 22-2) is high, internal signal XCS1b is synchronized to the signal at pin XCS1 (pad 20), and when the signal at pin CS2 is low, internal signal XCS1b is fixed high. Also, because n-channel transistor 302 is normally on, Pad 22-1 is fixed low and internal signal XOEa is synchronized with signal XCS1b. The operating waveforms for this device are shown in FIG. 2B. These are the same as the operating waveforms of FIG. 8B for conventional devices. Thus, by cutting fuse element 10 of program circuit 1 and connecting pin 22 of the lead frame by a bonding wire to bonding Pad 22-2 for positive-logic chip select control signal CS2, the semiconductor memory devices of type XCS1 and CS2 shown in FIG. 9B are realized. Because Pad 22-1 is fixed low by n-channel transistor 302, neither operating current nor direct current flows at NOR gate 300.

As described above, in embodiment 1 of the instant invention, because the activated input circuit is changed by cutting or not cutting the fuse element of the program circuit, the product type of the memory device can be switched if a fixed fuse of the program circuit is cut after the completion of the wafer fabrication process. Consequently, photomasks for every product type, as in conventional devices, become unnecessary, costs for mask construction are reduced, and mask management becomes easier. Also, a process to determine the product type during the manufacturing process becomes unnecessary, the production level and stock can be regulated after the manufacturing process, and production control is made easier. Further, costs can be reduced due to a reduction in production control and process expenses, and quicker delivery dates realized. At the same time, changes in the product type can be achieved without external pull-ups and pull-downs because the voltage potential of the unnecessary input stage of the input circuit is fixed or inactive.

In embodiment 1 of the instant invention, a plurality of input circuits are each independently connected to bonding pads. The selection of the product type of the memory device is done by connecting the lead frame, which receives external input signals, to bonding pads of the input circuits that have been activated and are among the plurality of independent bonding pads. In this way, the instant invention is realized without restricting the pin position of the memory device or restricting the shape of the lead frame. Even in cases where the connection position of the lead frame differs for each product type, the instant invention can be carried out without unreasonably forcing the bonding wire connections because the independent bonding pads can be appropriately arranged for each connecting position of the lead frame. Also, the shortest layout from the bonding pads to the input circuits can be achieved, and thus,, parasitic capacitance and resistance from the input pins reduced.

EMBODIMENT 2

Figure 3:
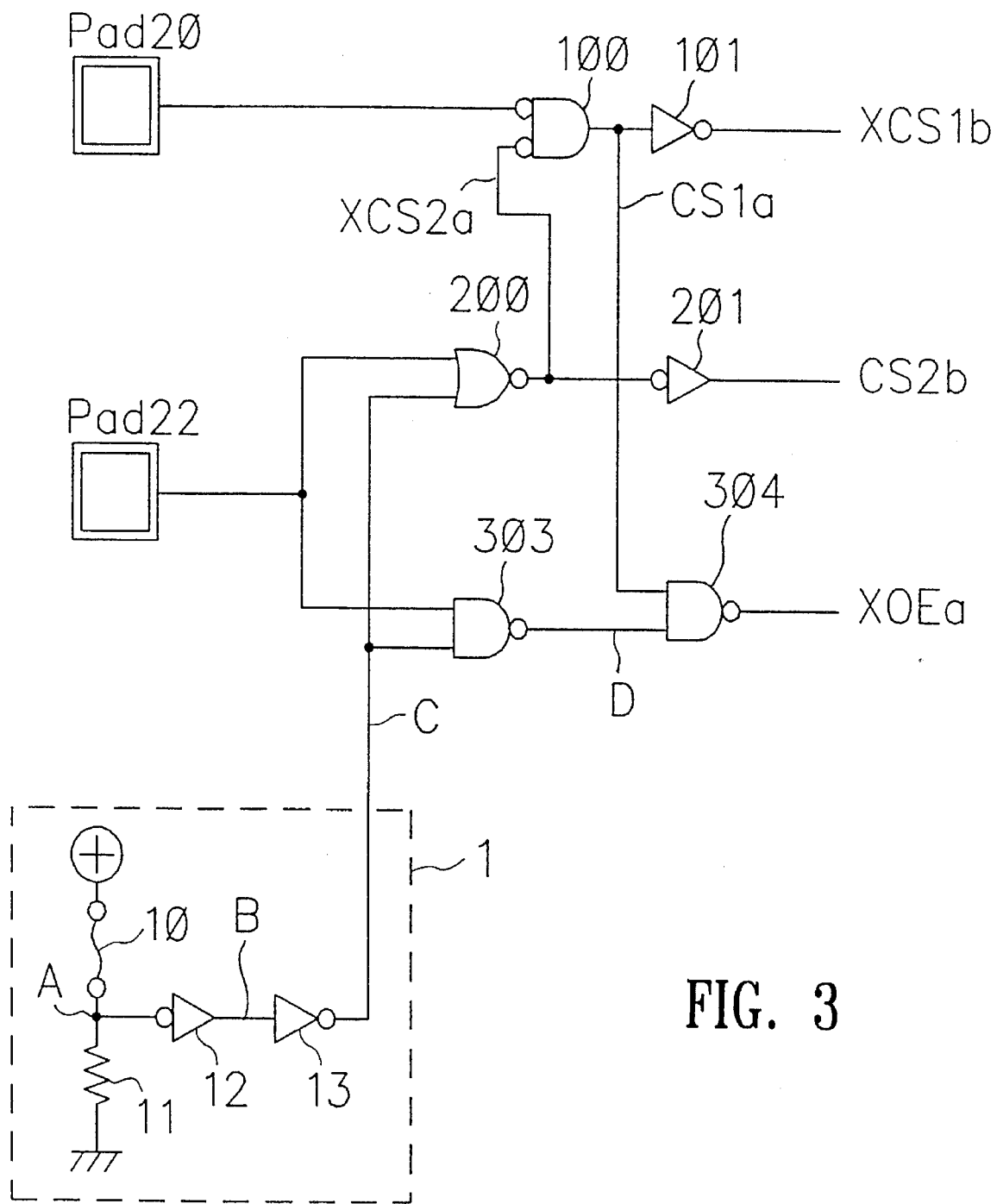
FIG. 3 is a schematic diagram of a semiconductor memory device having a program circuit and input circuits in accordance with the instant invention where a plurality of input circuits controlled by the program circuit are connected to the input circuit by common bonding pad.

FIG. 3 is a schematic diagram of a semiconductor memory device in accordance with embodiment 2 of the instant invention. Pad 22 is a common bonding pad connected to pin 22 which is the output control signal for pin XOE of FIG. 9A or is the positive-logic chip select control signal pin CS2 of FIG. 9B. One input of input stage NOR gate 200 and one input of input stage NAND gate 303 are connected commonly to Pad 22. The other inputs of gates 200 and 303 are connected to output C of program circuit 1. Internal signal XOEa comes from NAND gate 304 whose inputs are connected to the outputs of NAND gate 303 and NOR gate 100. The other circuits and connections in FIG. 3 have been described with reference to the conventional devices of FIGS. 7A and 7B and are not repeated here.

Figure 4A:
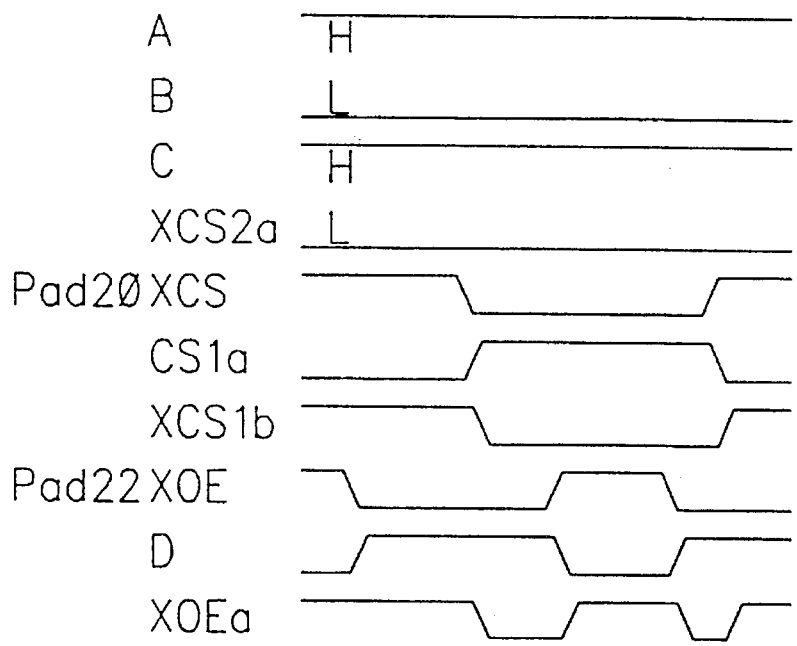
FIGS. 4A and 4B are diagrams containing operating waveforms of the circuit shown in FIG. 3.

In FIG. 3, when fuse element 10 of program circuit 1 is not cut, output C goes high, NOR gate 200 is deactivated, output signal XCS2a is set low without regard to the potential of Pad 22, and NAND gate 303 is activated and inverts the signal from Pad 22. Consequently, internal signal CS1a becomes the reverse of the chip select signal of pin XCS which is from Pad 20. If Pad 22 is used as the bonding pad for output control signal pin XOE, when CS1a goes high, in other words when in the chip select state, and when the output control signal of pin XOE which is from Pad 22 goes low, internal signal XOEa goes low. The operating waveforms for the device are shown in FIG. 4A. This is the same as the operating waveforms for conventional devices shown in FIG. 8A. Without cutting fuse 10 of the control circuit and using pin 22 as output control signal pin XOE, the semiconductor memory device of type XCS and XOE, which is shown in FIG. 9A, can be realized. Because one of the inputs into NOR gate 200 from program circuit 1 is normally high, the internal operating waveform does not change with the signal level of Pad 22; nor does operating current or direct current flow at NOR gate 200.

Figure 4B:
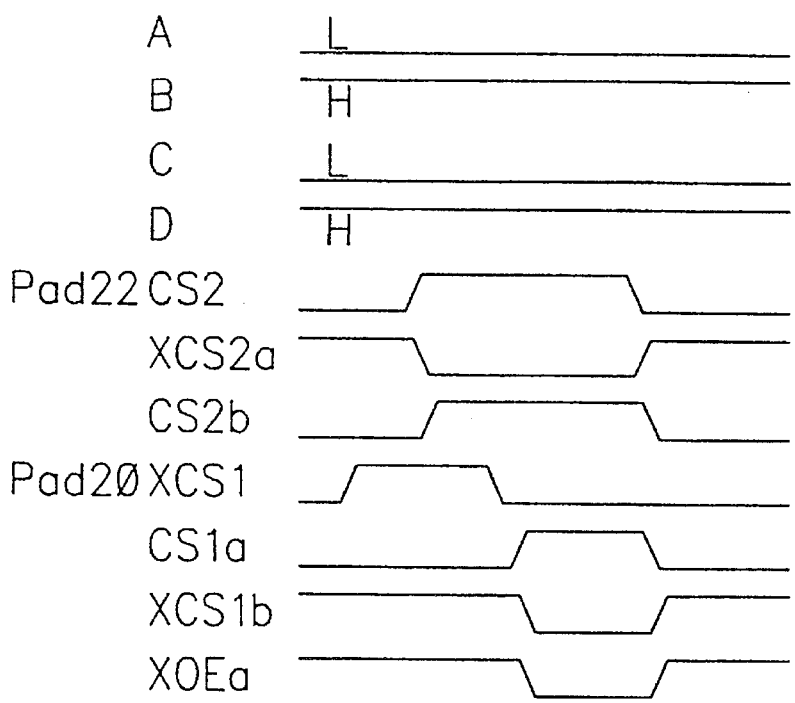

On the other hand, when fuse element 10 of program circuit 1 is cut, output C goes low, NOR gate 200 is activated and reverses the signal from Pad 22, NAND gate 303 is deactivated, and output D is fixed high regardless of the potential of Pad 22. If Pad 22 is used as a bonding pad for a positive-logic chip select signal, the output of NOR gate 200 provides signal XCS2a which is the inverse of the positive logic chip select signal. When the positive-logic chip select signal is high, internal signal CS1a becomes a signal which is the inverse of the XCS1 signal on Pad 20. When the signal at pin CS2 is low, in other words, when in chip non-select, internal signal CS1a becomes low. Because NAND gate 303 is deactivated and output D is normally high, internal signal XOEa becomes a signal opposite to, i.e. the inverse of, that of CS1a. The operating waveforms for this device are shown in FIG. 4B. These are the same as the operating waveforms of conventional devices shown in FIG. 8B. By cutting fuse 10 of program circuit 1 and using pin 22 as positive-logic chip select signal pin CS2, a semiconductor memory device of type XCS1 and CS2 can be realized. Because one of the inputs into NAND gate 303 from program circuit 1 is normally low, the internal operating waveform does not change with the signal level of Pad 22 nor does operating current or direct current flow at NAND gate 303.

Thus, in embodiment 2 of the instant invention, by only cutting or not cutting the fuse of program circuit 1, changes can be made in the product type of the semiconductor memory device types to be either XCS and XOE, or XCS1 and CS2. Further, the bonding pad connected to the lead frame is common and does not depend on the product type. As a representative example of the bonding pad region to which is connected the input circuit, one pad requires a large region within the semiconductor device of approximately 50,000 square micrometers when including a circuit for static electricity protection. However, in embodiment 2, by connecting a plurality of input circuits to a common bonding pad, the common bonding pad is utilized and a compact memory device with small chip size is obtained.

EMBODIMENT 3

Figure 5:
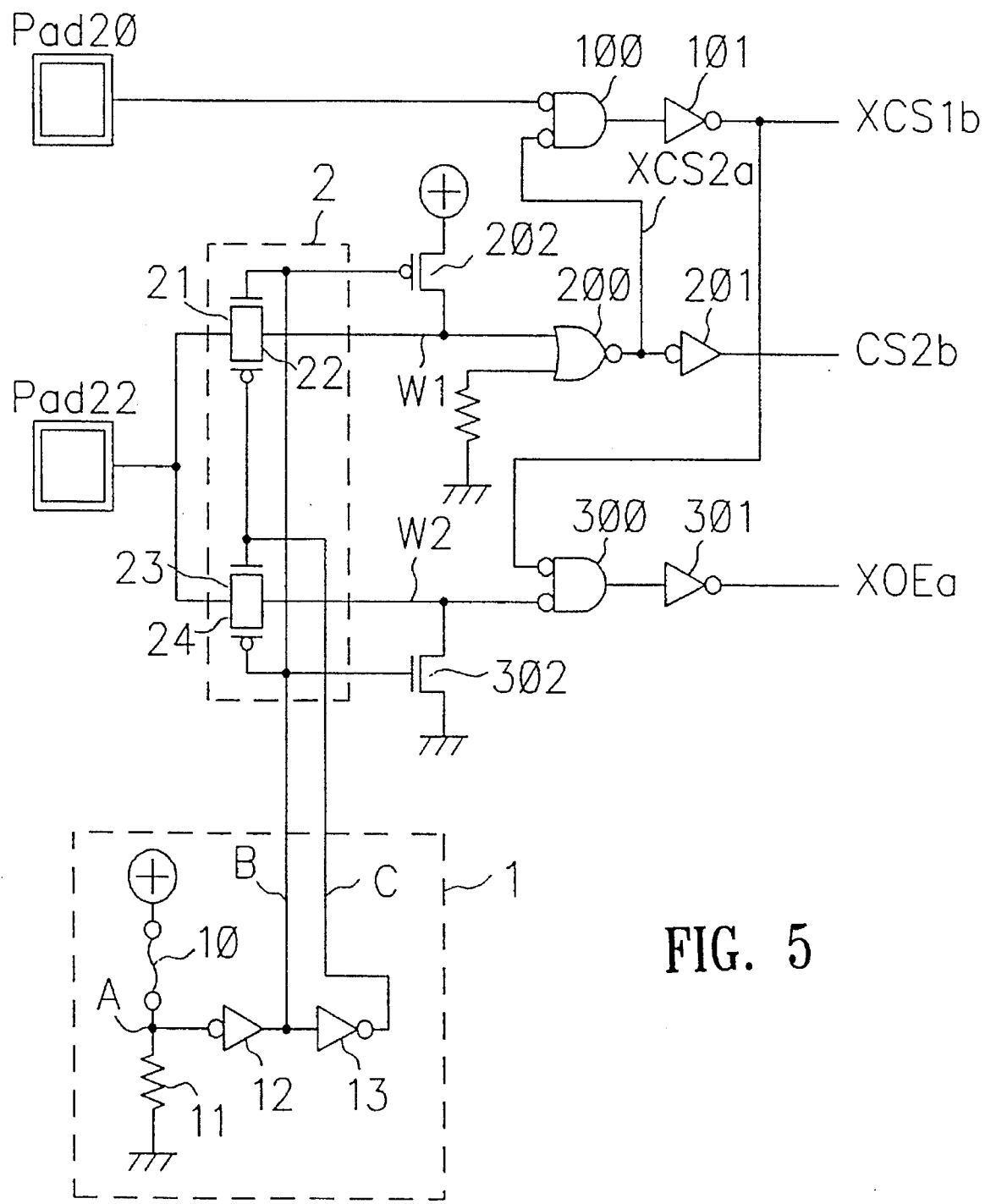
FIG. 5 is a schematic diagram of a semiconductor memory device having a program circuit, a plurality of input circuits controlled by the program circuit, and a plurality of switching means in accordance with the instant invention.
Figure 7A:
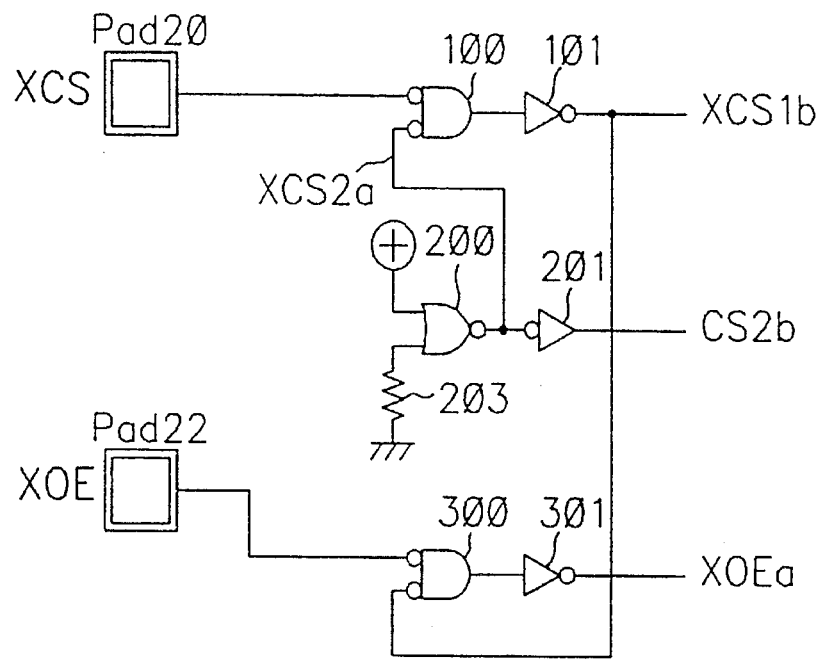
FIGS. 7A and 7B are schematic diagrams of an input circuit for a conventional semiconductor memory device.
Figure 7B:
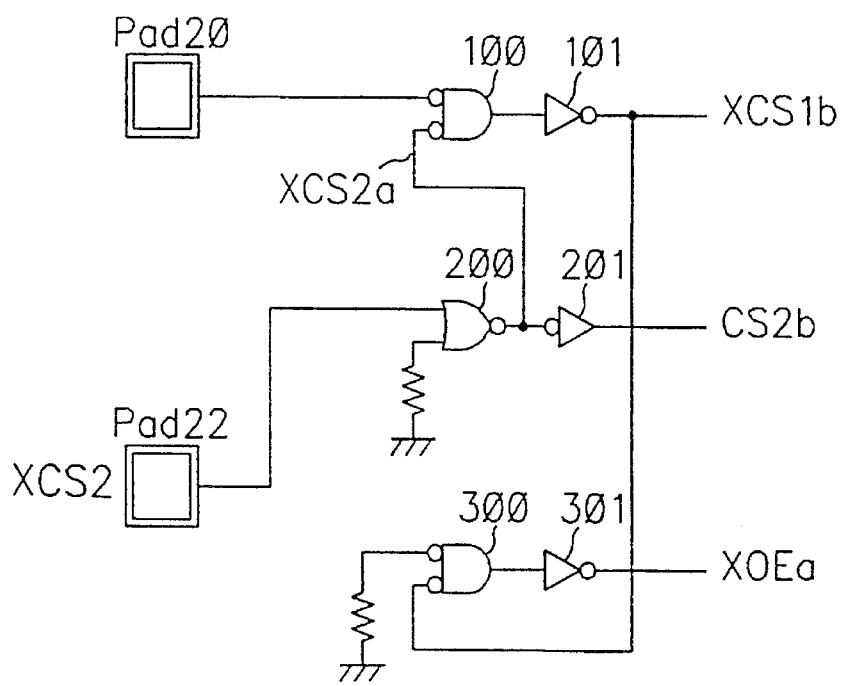

FIG. 5 is a schematic diagram of a semiconductor memory device in accordance with embodiment 3 of the instant invention. Pad 22 is a bonding pad which is connected to a positive-logic chip select control signal pin CS2 or an output control signal pin XOE, to receive signals which come in externally. Unit 2 is a switching means comprising n-channel transistors 21 and 23 and p-channel transistors 22 and 24 and arranged between bonding Pad 22 and the input stages of the input circuit, NOR gate 200 and NOR gate 300. The gates of n-channel transistor 21 and p-channel transistor 24 are connected to output B of program circuit 1. The gates of n-channel transistor 23 and p-channel transistor 22 are connected to output C of program circuit 1. The on-state of switching means 2 is controlled by the output of the program circuit. One of the inputs of input stage NOR gate 200 is connected to Pad 22 through switching means 2. The gate of a p-channel transistor 202 is connected to output B of program circuit 1 and the one input of gate 200 is connected to the drain of p-channel transistor 202 whose source is connected to the voltage source. The other input of input stage NOR gate 200 is connected to VSS by a resistor. One of the inputs of input stage NOR gate 300 is connected to Pad 22 through switching means 2 and to the drain of n-channel switching transistor 302, the gate of n-channel transistor 302 is connected to output B of program circuit 1, and the source is connected to ground. The other input of input stage NOR gate 300 is connected to receive internal signal XCS1b. Explanations of other circuits and connections in FIG. 5 which are explained with reference to the conventional devices of FIGS. 7A and 7B are omitted.

Figure 6A:
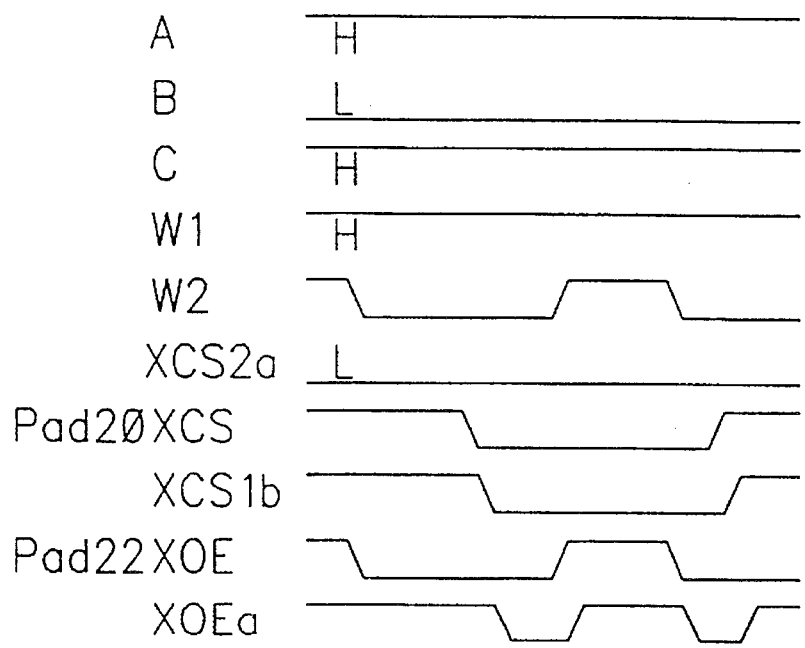
FIGS. 6A and 6B are diagrams containing operating waveforms of the circuit shown in FIG. 5.
Figure 8A:
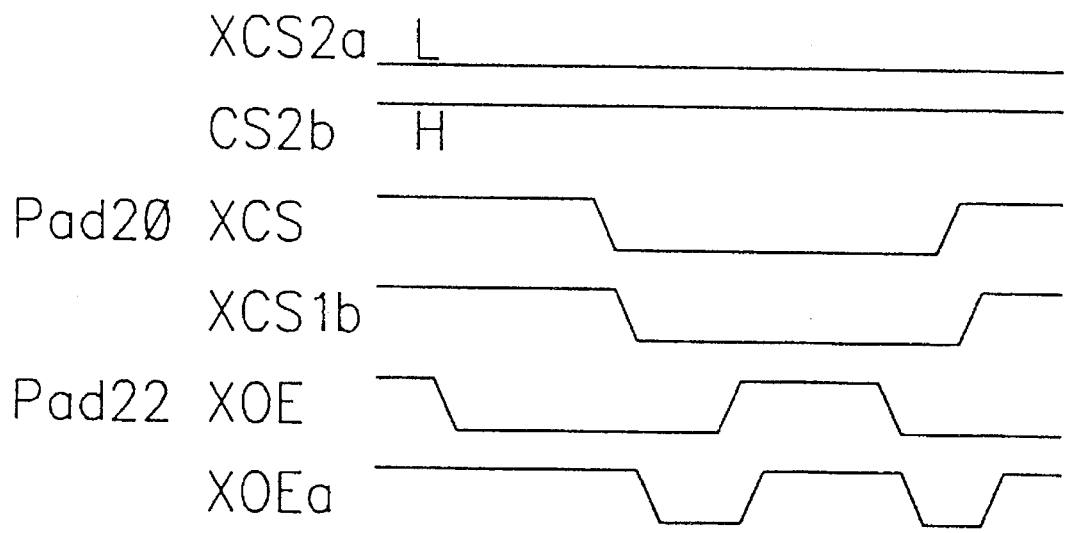
FIGS. 8A and 8B are diagrams containing operating waveforms of the circuit shown in FIG. 5.

In FIG. 5, when fuse element 10 of program circuit is not cut, output B goes low, output C goes high, and in switching means 2, n-channel transistor 23 and p-channel transistor 24 switch to the on-state and n-channel transistor 21 and p-channel transistor 22 switch to the off-state. At the same time, because n-channel transistor 302, whose gate is connected to output B, turns off, Pad 22 is electrically connected to the input of NOR gate 300, the one input of NOR gate 200 is disconnected from Pad 22, and the gate of n-channel transistor 302 is fixed to the voltage source potential via p-channel transistor 202 whose gate is connected to output B. Consequently, the output XCS2a of NOR gate 200 is fixed low and is not affected by the potential of Pad 22 and NOR gate 100 becomes a gate that inverts the signal from Pad 20. At this time, internal signal XCS1b becomes synchronized with the chip select signal coming from Pad 20 (pin XCS). If the output control signal is connected to Pad 22 (pin XOE), when XCS1b goes low, in other words, during the chip select state, and the output control signal, which comes from Pad 22, goes low, internal signal XOEa goes low. The operating waveforms during this time for the device are shown in FIG. 6A. These are the same as the operating waveforms of a conventional device as shown in FIG. 8A. By not cutting the fuse of the program circuit and using pin 22 of FIG. 9A as output control signal pin XOE, a semiconductor memory device of type XCS and XOE shown in FIG. 9A is realized. Here, because one of the inputs into NOR gate 200 from p-channel transistor 202 is normally high, the internal operating waveform does not change with the signal level of Pad 22 nor does operating current or direct current flow at NOR gate 200.

Figure 6B:
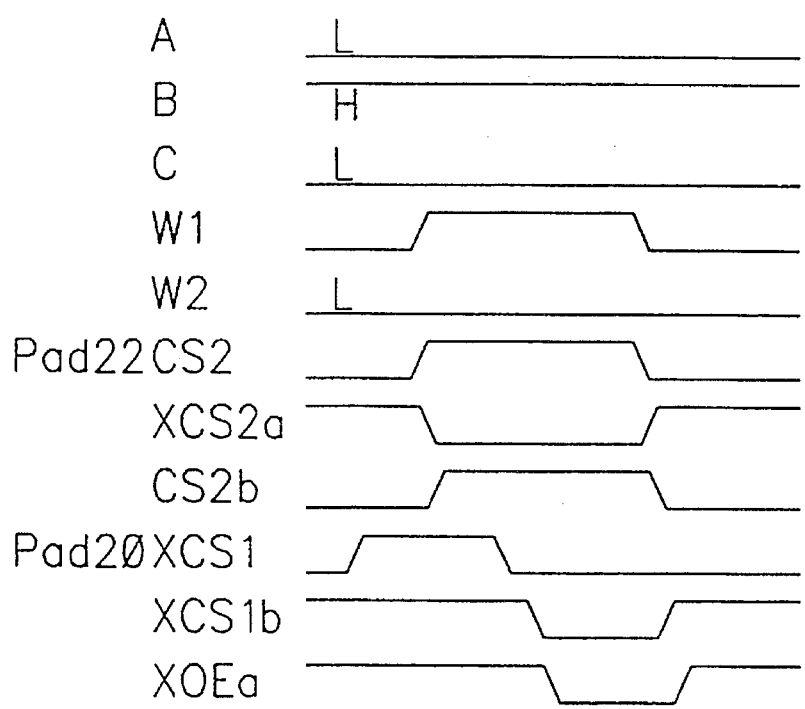
Figure 8B:
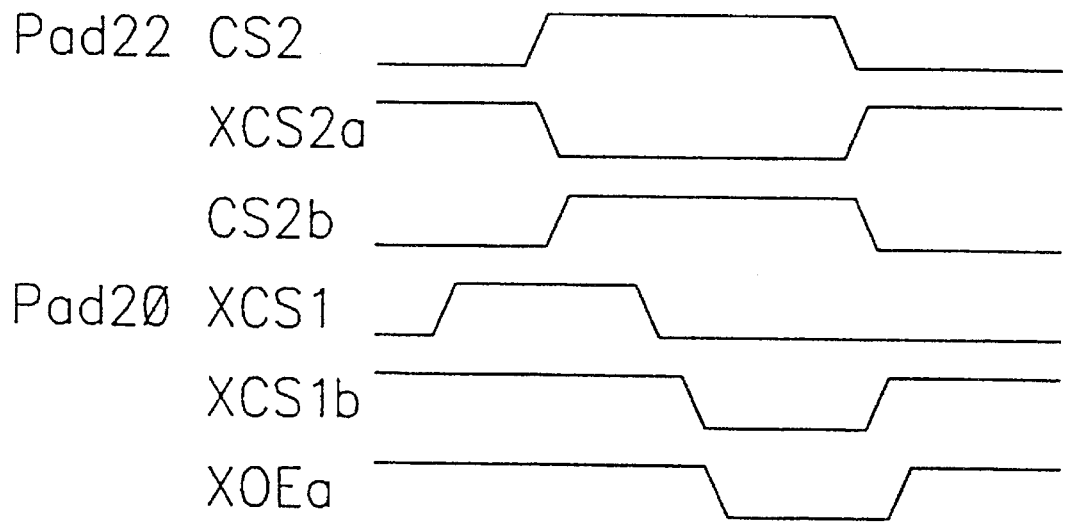

On the other hand, when fuse element 10 of program circuit 1 is cut, output B goes high, output C goes low, and within switching means 2, n-channel transistor 23 and p-channel transistor 24 switch to the off-state and n-channel transistor 21 and p-channel transistor 22 switch to the on-state. At the same time, because p-channel transistor 202, whose gate is connected to output B, turns off, Pad 22 is electrically connected to the one input of NOR gate 200, and the one input of NOR gate 300 is disconnected from Pad 22, and is fixed to the ground potential via n-channel transistor 302 which is connected to output B. Consequently, NOR gate 200 inverts the signal from Pad 22 and NOR gate 300 inverts internal signal XCS1b. If a positive-logic chip select signal is connected to Pad 22 (pin CS2) NOR gate 200 inverts that signal. When the CS2 signal goes high, internal signal XCS1b is synchronized to the XCS signal from Pad 20. When the CS2 signal goes low, in other words, when in the chip non-select state, internal signal XCS1b goes high. Because one input of NOR gate 300 is normally low, internal signal XOEa is synchronized to XCS1b. The operating waveforms during this time for the device are shown in FIG. 6B. These are the same as the operating waveforms for conventional devices as shown in FIG. 8B. By cutting the fuse of the program circuit and using pin 22 as positive-logic chip select signal pin CS2, a semiconductor memory device of type XCS1 and CS2 shown in FIG. 9B is realized. Here, because one of the inputs into NOR gate 300 from n-channel transistor 302 is normally high, the internal operating waveform does not change with the signal level of Pad 22 nor does operating current or direct current flow at NOR gate 300.

Thus, in embodiment 3 of the instant invention, by only cutting or not cutting fuse 10 of program circuit 1, changes can be made in the product type of the semiconductor memory device to be either type XCS and XOE, or type XCS1 and CS2. Further, the bonding pad connected to the lead frame is common and does not depend on the product type. Consequently, in embodiment 3, a commonality in the bonding pads and a reduction in the chip size of the memory device is realized. Also, because only input circuits necessary for operation are selectively connected by switching means, the parasitic capacitance at the bonding pads, namely, the capacitance of the input pins, is only the capacitance of the necessary input circuits and the capacitance of the necessary wiring. In general, due to restrictions in the circuit arrangement, the input circuit, which is changed at the time of selection of the product type, is not limited to being arranged near the bonding pads that are connected. The wiring shown in FIG. 5 by W1 and W2 are a few millimeters in length. For example, in the case when a three millimeter metal wiring and one TTL compatible NOR gate is connected, the parasitic capacitance of W1 is approximately 1 picofarad. In embodiment 3, selection of the product type is possible without an increase in the pin capacitance due to unwanted capacitance, current consumption due to the charging and discharging of the capacitance, and delays in the signal.

EMBODIMENT 4

The semiconductor memory device in accordance with embodiment 4 of the instant invention will be explained using the schematic diagram of the semiconductor memory device of FIG. 1. In FIG. 1, as discussed previously, when fuse element 10 of program circuit 1 is not cut, it is set to type XCS and XOE, and when fuse element 10 is cut, it is set to type XCS1 and CS2. In SRAM applications, type XCS1 and CS2 can be used in systems that use power-down mode, especially in specific uses of battery pack applications. On the other hand, in types providing for XOE instead of CS2, the activation of the output of the semiconductor memory device can be controlled by XOE. Also, control of the data of the data bus line of a system where outputs of a plurality of memory devices are connected commonly can be easily performed. Thus, the range of applications is broad, covering over 90 percent of all SRAM devices made. In embodiment 4 of the instant invention, when the fuse of the program circuit is not cut, the device is fixed to type XOE, which is the most common type. Other product types are only fixed when the fuse is cut. In other words, cutting the fuse is unnecessary for creating the XOE product type which is the most common. Cutting the fuse is only necessary when setting up product types other than XOE. Therefore, process steps and time relating to cutting the fuse for product type selection at the end of the semiconductor manufacturing process can be minimized. Also, besides the SRAM example discussed above, by setting the product type which is made in the largest quantity to be the type when the fuses of the program circuit are not cut, process steps and time relating to cutting the fuse for product type selection can be minimized.

EMBODIMENT 5

Figure 10:
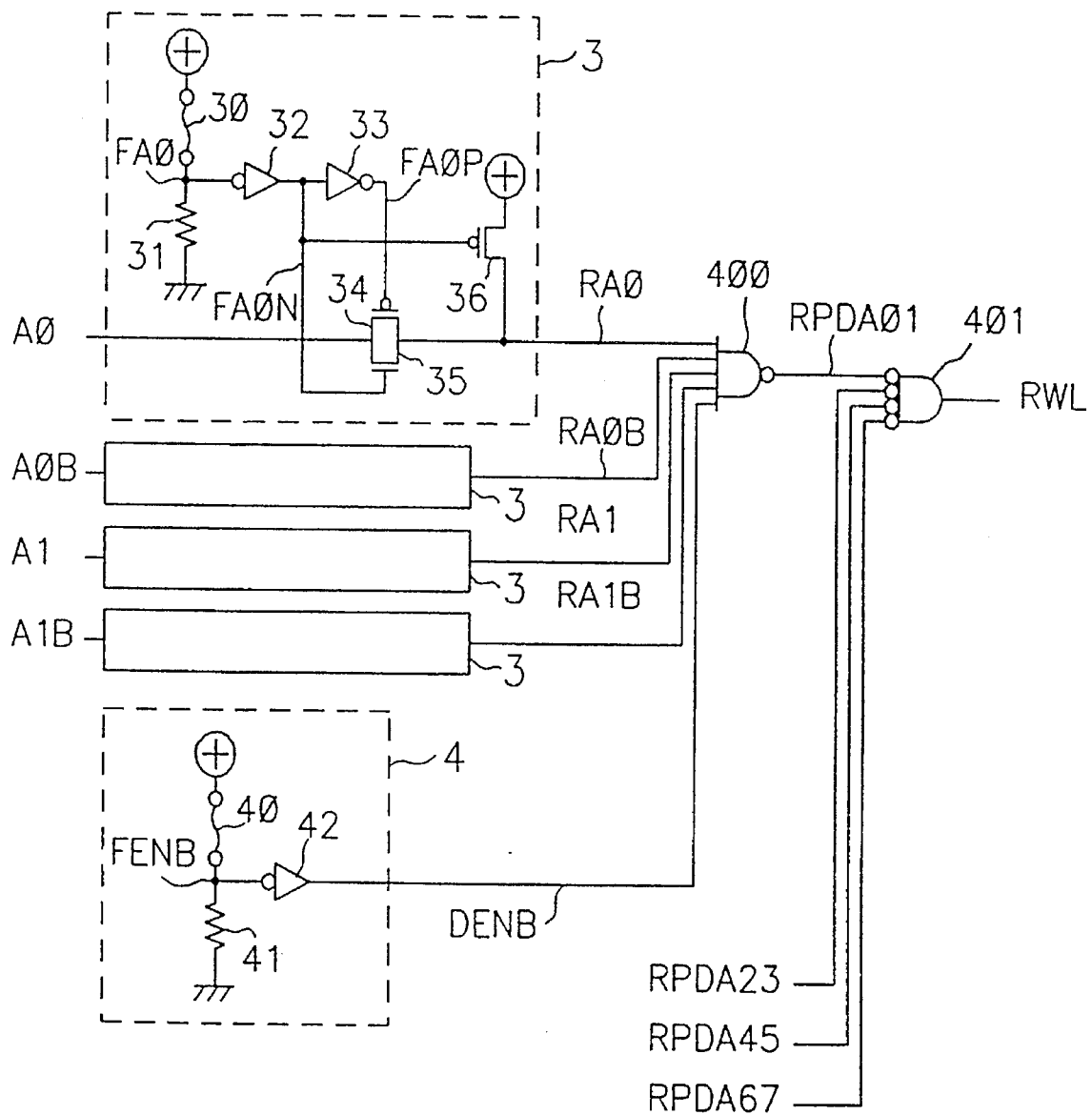
FIG. 10 is a schematic diagram of a redundant decoder circuit that designates redundant memory cells in conventional semiconductor memory circuits.

The semiconductor memory device in accordance with embodiment 5 of the instant invention will be explained with respect to the schematic diagram of the semiconductor memory device of FIG. 1 and by referring to FIG. 10, which shows a redundant decoder circuit for conventional semiconductor memory devices, FIG. 11, which shows the layout of a redundant fuse, and FIG. 12, which shows the cross-sectional structure of a redundant fuse. In embodiment 5 of the instant invention, the fuse circuit within the program circuit, its structure, and layout are the same as the redundant fuse.

Many of the semiconductor memory devices of recent years have been equipped with a redundant memory cell for improving the yields. FIG. 10 shows a schematic diagram of a redundant decoder for designating the redundant memory cell in a conventional semiconductor memory device. It is comprised of redundant program circuits 3 for programming defective addresses, redundant address decoder NAND gate 400, NOR gate 401, and redundant activation circuit 4, which activates the redundant decoder. In FIG. 10, a redundant decoder for selecting one redundant word line RWL will be explained as an example using complementary data of row address A0 to A7 (A2 through A7 will be omitted). Each redundant program circuit 3 is comprised of redundant fuse element 30 having a low resistance, resistor 31 having a high resistance, inverters 32 and 33, p-channel transistors 34 and 36, and n-channel transistor 35. When redundant fuse 30 is not cut, connection point FA0, where redundant fuse element 30 and large resistor 31 are connected, goes high. Thus, the output FA0P of inverter 32 goes low, the output FA0P of inverter 33 goes high, p-channel transistor 34 and n-channel transistor go to the off-state, p-channel transistor 36 goes to the on-state, and output RA0 of redundant program circuit 3 is set high. On the other hand, when fuse 30 is out, p-channel transistor 36 goes to the off-state, p-channel transistor 34 and n-channel transistor 35 go to the on-state, and address data A0 is conducted to NAND gate 400. Redundant activation circuit 4 is comprised of fuse element 40 of low resistance, large resistor 41, and inverter 42. It outputs activation signal DENB of the redundant decoder. In FIG. 10, when using the redundant decoder, low resistance fuse 40 of redundant activation circuit 4 is cut at the same time as making an appropriate cut of the fuse of redundant program circuits 3 and programming the row address of the defective memory cell. When the row address of the defective memory cell is input in this sate, all the inputs of NAND gate 400 go high and RPDA01 goes low. In the same way, RPDA23 through RPDA67, which correspond to addresses A2 through A7, respectively, go low, and redundant word line RWL, which is the output of NOR gate 401, is selected.

FIG. 11 is a layout showing redundant fuse 30, large resistor 31, and pull-out portion of signal FA0 in redundant program circuit 3 of a conventional semiconductor memory device. It is formed of two layers of polysilicon and one layer of metal (A1). Redundant fuse 30 and high resistance 31 are constructed of two layers of polysilicon (PLYB) 65. However, in order to raise its ability to be cut by a laser, redundant fuse 30 is formed by etching the insulating film of the upper portion of the fuse to an appropriate thickness at pad-open pad 66 and large resistor 31 is formed by not selectively injecting impurities at region HR 67 after PLYB lamination. One of the terminals of redundant fuse 30 and large resistor 31 are connected to VDD metal, or bus 60 and GND metal, or bus, 61, respectively, via through-holes (THAB) 69, the first layer of polysilicon (PLYA) 62 or 63, and respective contact hole (CONT) 68. The other terminals of redundant fuse 30 and large resistor 31 are connected together and are pulled out through THAB 69 and PLYA64 as connection point FA0. The fuse is cut by melting PLYB 62 by a laser beam.

Figure 12A:
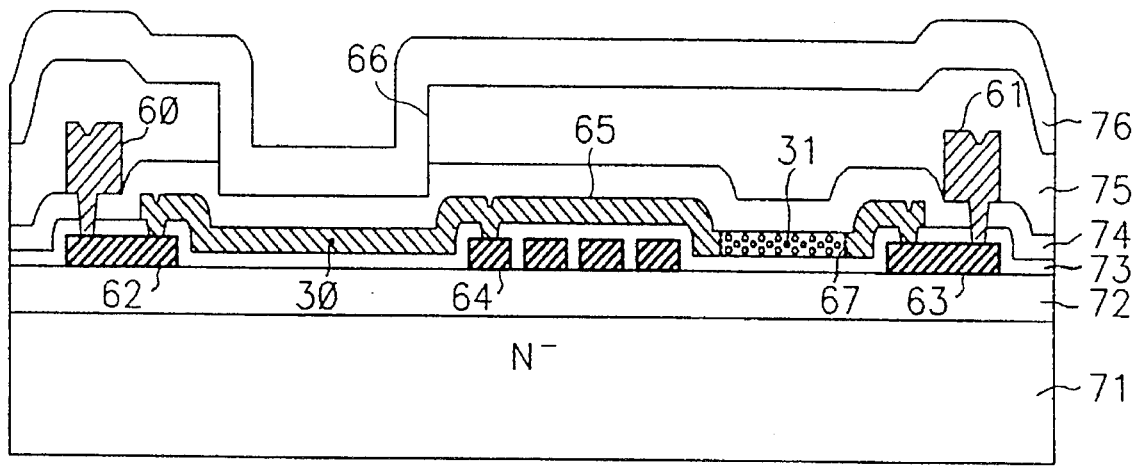
FIGS. 12A and 12B are cross-sectional views of the structure of the redundant fuse of a conventional semiconductor memory device.
Figure 12B:
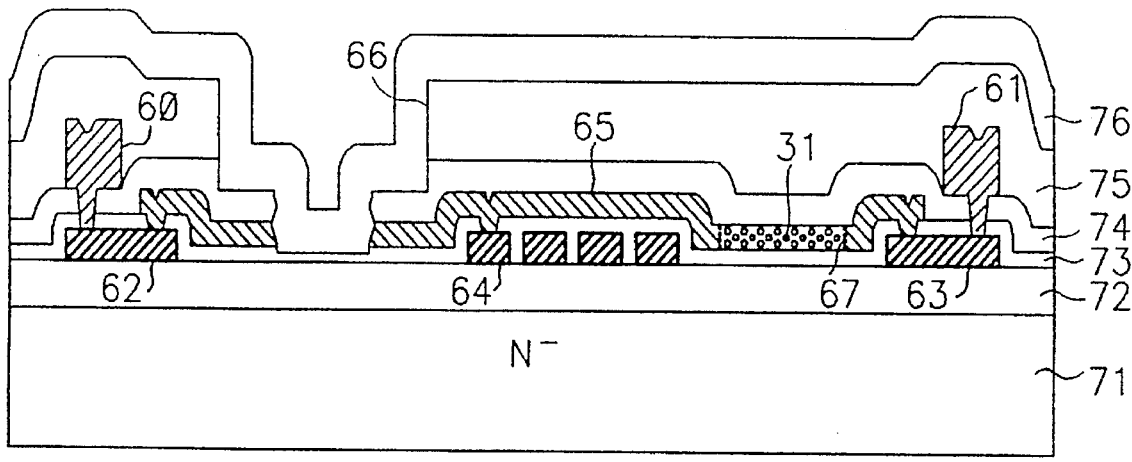

FIGS. 12A and 12B are cross-sectional views along line A–B of FIG. 11. FIG. 12A is a cross-sectional view when the fuse is not cut, and FIG. 12B is a cross-sectional view when the fuse is cut. In FIGS. 12A and 12B, 71 is an n-type semiconductor substrate, 72 is an element separation layer such as a LOCOS (Local Oxidation of Silicon) layer, 73 is an insulating film between layers PLYA and PLYB, 74 is an insulating film between layers PLYB and A1 metal 60 and 61, 75 is a passivation layer, and 76 is a protection layer. As shown in FIG. 12B, protection layer 76 is applied so as to completely cover the melted portion of the fuse to prevent reliability problems caused by moisture entering the device through the melted portion of the fuse.

As shown in FIG. 1, program circuit 1 is comprised of fuse element 10, high resistance resistor 11, and inverters 12 and 13. These have the same circuit structure as the redundant fuse element 30 of redundant program circuit 3, large resistor 31, and inverters 32 and 33 shown in the conventional device of FIG. 10. Along with being able to make the circuit structure the same, fuse element 10, the resistance value of each resistor 11 and the dimensions can be made the same. Also, the layout of fuse element 10 and high resistance resistor 11 can be made the same as the layout of the conventional device in FIG. 11. Similarly, the cross-section of fuse element 10 and high resistance resistor 11 can be constructed similar to the conventional device of FIG. 12.

Consequently, in embodiment 5 of the instant invention, through making the circuit, structure, and layout of the fuse element in the program circuit the same as the redundant fuse, fuse elements of the program circuit can be realized using the wafer manufacturing process of conventional devices and without using additional photomasks or manufacturing processes for the fuse element of the program circuit. Therefore, with embodiments of the instant invention, the instant invention can be put into practice without an increase in manufacturing cost and manufacturing time.

EMBODIMENT 6

The semiconductor memory device in accordance with embodiment 6 of the instant invention will be explained. In embodiment 6 of the instant invention, the cutting of fuse element 10 of program circuit 1 shown in FIG. 1 is done by the same process as the cutting of redundant fuse element 30 which designates the address of the memory cell for defect correction. The cutting process of redundant fuse 30 of a conventional device will be explained using the cross-sectional views of FIGS. 12A and 12B. This process comprises a first pad open process ("PAD 1 process") for opening the upper portion of the fuse and a portion of the bonding pad after the formation of passivation layer 75, a first test process ("TEST 1") using a memory tester, among others, for detecting the initially defective memory cell addresses, a repair process fur cutting with a laser device the redundant fuses that correspond to the defective memory cell addresses, a second pad open process ("PAD 2 process") for opening the bonding pad portion after formation of protective layer 76 on the upper portion of the device, and a second test process ("TEST 2") for finally distinguishing good products and defective products when in the wafer state. In the semiconductor memory device of the instant invention, as discussed above, when the fuses of program circuit 1 are not cut, a specific product type results among several possible product types. Thus, the testing of defective memory cell addresses by TEST 1 can be performed in the same manner as in conventional devices. Also, because the structure of fuse element 10 of the instant invention is the same structure as redundant fuse 30 of a conventional device, the cutting of both fuse element 10 and redundant fuse 30 can be done during the same repair process under similar conditions. The cutting of fuse element 10 in the repair process can be done before the cutting of redundant fuse 30 after the cutting of redundant fuse 30.

In embodiment 6 of the instant invention, by cutting fuse element 10 in the program circuit with the same process used for cutting redundant fuse 30, the fuse element can be cut during the manufacturing process of conventional devices without using additional repair processes or detection processes for cutting element 10. Further, the instant invention can be realized without an increase in manufacturing cost or time. The instant invention can even be used in wafer manufacturing processes where there is no PAD 2 process for forming protection layer 76 after the repair process. In this situation, the selection of the product type is done after the completion of the wafer manufacturing process.

EMBODIMENT 7

FIG. 13 shows the layout of a semiconductor memory device in accordance with embodiment 7 of the instant invention. In FIG. 13, 80 and 81 are metal patterns (A1) for distinguishing the product types, 82 and 83 are each a second layer of polysilicon (PLYB) which corresponds to a metal pattern 80 or 81, and 86, 87, 88, 89, 90 and 91 are dummy fuses with pad-open pads 84 and 85. The cutting of dummy fuses corresponding to a product type is done at the same time as the cutting of fuse elements 10 in the program circuit discussed above. In this manner, recognition of product types after wafer manufacturing can easily be done by observing, through a microscope, the cut dummy fuses and the corresponding metal patterns for product type recognition. For example, recognition could be done in the following manner: if dummy fuses 86, 87, and 88 are cut, it is the first type among a plurality of product types, if dummy fuses 89, 90 and 91 are cut, it is the second type, and if no fuses are cut, a third type. In the embodiment of FIG. 13, additional photomasks and manufacturing processes for the manufacturing of dummy fuses are unnecessary because the dummy fuses have the same structure as the redundant fuses. Also, because the cutting of dummy fuses can be done in the same type of process as the cutting of fuses of the program circuit and redundant fuses, there is no increase in the number of repair processes. Consequently, in embodiment 7 of the instant invention, product recognition can be done easily without an increase in manufacturing cost or time.

USES IN INDUSTRY

A semiconductor memory device which selects the product type by a program circuit that includes fuses is not limited to changing between types XOE and CS2. Other applied examples include selection of address input circuits and data input/output circuits for operation changes in product types where the word structure differs for the same memory contents. It can be applied to changes in the input circuit for changing such things as the page mode or static column mode of a dynamic random access memory. Further, it is effective in changing between positive-logic and negative-logic in input circuits.

Also, the structure of the fuse circuit in each product type does not need to be limited to a combination with a resistor. Circuit structures with a combination of resistor and transistor or resistor and capacitor are also appropriate. Although an example of cutting the fuse by melting it with a laser was used above, a method of melting by current is also possible.

This application relates to subject matter disclosed in Japanese Application numbers Hei 4-264927, filed on Oct. 2, 1992 and Hei 5-80902, filed on Apr. 7, 1993, and International Application No. PCT/JP93/01418, filed on Oct. 4, 1993, the disclosures of which are incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A semiconductor device comprising:

a plurality of pads;

a plurality of input circuits each having an input stage which is connected to one of said pads; and a program circuit connected to said input stage of each of at least two of said input circuits, said program circuit having at least one fuse which can be cut, wherein said input stage of each of said at least two input circuits comprises a logic gate having a first input terminal which is directly conductively connected to a respective pad and a second input terminal connected to said program circuit, and said program circuit is operative for rendering inactive said logic gate of said input stage of one of said at least two input circuits depending on whether or not said fuse is cut.

2. A semiconductor memory device comprising:

a bonding pad for supplying an external input signal;

a program circuit which includes at least one fuse that can be cut, said program circuit producing an output having a first value for selecting a first product type of said device when said fuse is not cut or a second value for selecting a second product type of said device when said fuse is cut;

first and second input circuits each having an input stage; and a plurality of switching means arranged between said bonding pad and said input stage of each of said input circuits, each of said switching means being controllable to have one of an on-state for conductively connecting said bonding pad to the input stage of a respective input circuit and an off-state for electrically disconnecting said bonding pad from the input stage of the respective input circuit, wherein said program circuit is connected to said input stage of each of said input circuits and to each of said switching means for causing said input stage of one of said input circuits to be active, one of said switching means arranged between said bonding pad and said input stage of said one of said input circuits to be in its on-state, said input stage of the other one of said input circuits to be inactive or to be at a fixed potential, and the other one of said switching means arranged between said input stage of said other one of said input circuits and said bonding pad to be in its off-state in response to said program circuit output.

3. A semiconductor memory device comprising:

a program circuit which includes at least one fuse that can be cut, said program circuit producing an output signal having a first value for selecting a first product type of said device when said fuse is not cut or a second value for selecting a second product type of said device when said fuse is cut, the first product type being produced in larger numbers than the second product type;

a plurality of input circuits each having an input stage connected to receive an external input signal and being connected to said program circuit to be activated depending on whether or not said fuse is cut in order to pass the external input signal, wherein one of said input circuits is an input circuit for output control (XOE); and at least the input stage of said input circuit for output control is activated, and becomes a type for providing an output control pin, when no fuse of said program circuit is cut.

4. A semiconductor memory device comprising:

a plurality of pads;

a plurality of input circuits each having an input stage connected to one of said pads for receiving an external input signal;

a redundant decoder circuit, including a redundant fuse which can be cut, for replacing a defective memory cell with a redundant memory cell; and a program circuit which includes at least one programming fuse which can be cut, wherein at least one of said pads receives an external input signal;

the input stage of at least one of said input circuits is connected to said program circuit and is directly connected to said one of said pads, said redundant fuse and said programming fuse are formed by the same process step, and the input stage of said at least one of said input circuits is activated according to whether or not said programming fuse is cut, thereby enabling selection of a product type of said memory device, and replacement of the defective memory cell with the redundant memory cell occurs according to whether or not said redundant fuse has been cut.

5. A semiconductor device comprising a program circuit which includes at least one fuse that can be cut, said program circuit producing an output signal having a first value for selecting a first product type of said device when said fuse is not cut or a second value for selecting a second product type of said device when said fuse is cut;

a plurality of input circuits each having an input stage connected to receive an external input signal and being connected to said program circuit to be activated depending on whether or not said fuse is cut in order to pass the external input signal; and means for identifying the selected product type comprising a plurality of visually distinguishable dummy fuses, said dummy fuses being cuttable in a plurality of patterns each representing a respective product type.

6. A semiconductor device as defined in claim 5 wherein said means for identifying further comprise visually distinguishable metal elements each associated with at least a respective one of said dummy fuses.

7. A semiconductor device as defined in claim 5 wherein each dummy fuse and the at least one fuse of said program circuit are cuttable by the same process.

8. The semiconductor memory device of claim 4, wherein the cutting of the fuse of the program circuit that determines the product type of said semiconductor memory device is the same process as the cutting of the redundant fuse that designates the address of the redundant memory cell for defective cell replacement.

9. A semiconductor device comprising:

a plurality of pads;

a plurality of input circuits each having an input stage which is connected to one of said pads; and a program circuit connected to said input stage of each of at least two of said input circuits, said program circuit having at least one fuse which can be cut, wherein said input stage of each of said at least two input circuits comprises a logic gate having a first input terminal which is directly conductively connected to a respective pad and a second input terminal connected to said program circuit, and said program circuit is operative for rendering inactive said logic gate of at least one said input stage depending on whether or not said fuse is cut.

* * * * *